(12) United States Patent
Luo et al.

(10) Patent No.: US 10,811,096 B2
(45) Date of Patent: Oct. 20, 2020

(54) MULTI-BLOCK NON-VOLATILE MEMORIES WITH SINGLE UNIFIED INTERFACE

(71) Applicant: Aspiring Sky Co. Limited, Hong Kong (CN)

(72) Inventors: Zhijiong Luo, Hopewell Township, PA (US); Shu Wang, Shanghai (CN); Xiaoming Jin, Shanghai (CN)

(73) Assignee: Aspiring Sky Co. Limited, Hong Kong (CN)

(*) Notice: Subject to any disclaimer, the term of this patent is extended or adjusted under 35 U.S.C. 154(b) by 83 days.

(21) Appl. No.: 15/981,920

(22) Filed: May 17, 2018

(65) Prior Publication Data
US 2018/0336948 A1 Nov. 22, 2018

Related U.S. Application Data

(60) Provisional application No. 62/508,668, filed on May 19, 2017.

(51) Int. Cl.
| | |
|---|---|
| *G11C 14/00* | (2006.01) |
| *G11C 16/10* | (2006.01) |
| *G11C 16/04* | (2006.01) |
| *G11C 16/26* | (2006.01) |
| *G11C 16/20* | (2006.01) |
| *G11C 7/10* | (2006.01) |
| *G11C 16/32* | (2006.01) |
| *G11C 11/00* | (2006.01) |

(52) U.S. Cl.
CPC ........ *G11C 14/0063* (2013.01); *G11C 7/1039* (2013.01); *G11C 7/1051* (2013.01); *G11C 7/1078* (2013.01); *G11C 11/005* (2013.01); *G11C 16/04* (2013.01); *G11C 16/10* (2013.01); *G11C 16/107* (2013.01); *G11C 16/20* (2013.01); *G11C 16/26* (2013.01); *G11C 16/32* (2013.01)

(58) Field of Classification Search
CPC ................ G11C 11/56; G11C 11/5628; G11C 2211/5641
See application file for complete search history.

(56) References Cited

U.S. PATENT DOCUMENTS

| | | | |
|---|---|---|---|
| 8,139,406 B2* | 3/2012 | Park | G11C 11/5628 365/185.02 |
| 9,710,397 B2* | 7/2017 | Macko | G06F 12/123 |
| 2017/0199703 A1* | 7/2017 | Ravimohan | G06F 12/0607 |
| 2019/0164598 A1* | 5/2019 | Shukla | G11C 5/148 |

* cited by examiner

*Primary Examiner* — Tuan T Nguyen
(74) *Attorney, Agent, or Firm* — Hertzberg, Turk & Associates, LLC

(57) ABSTRACT

A memory system may include one or more hybrid fast memory blocks with m-bit fast volatile random access memory (RAM) cells and N×m bit non-volatile memory (NVM) cells. The memory system may also include one or more other memory blocks with NVM cells. The fast flash memory may buffer the NVM data improving access speed. The different memory blocks may utilize a single, unified interface to communicate with other devices/circuits. The unified interface may be a parallel interface (e.g., flash memory/SRAM combinations), or the unified interface may be a pipeline interface (e.g., system on a chip "SOC" implementations) supporting fast memory read/write operations.

17 Claims, 11 Drawing Sheets

| | Reg Bit | Type | Cycle Number |
|---|---|---|---|
| Fast Flash | 000 | Asyn | 0 |
| | 001 | Asyn | 1 |
| | 010 | Asyn | 2 |
| | 011 | Asyn | 3 |
| | ... | ... | ... |
| | 111 | Syn | Dynamic(>0) |
| Normal Flash | 000 | Asyn | 0 |
| | 001 | Asyn | 1 |
| | 010 | Asyn | 2 |
| | 011 | Asyn | 3 |
| | ... | ... | ... |
| | 111 | Syn | Dynamic(>0) |

FIG. 6

MULTI-BLOCK NON-VOLATILE MEMORIES WITH SINGLE UNIFIED INTERFACE

CROSS REFERENCE TO RELATED APPLICATIONS

This application claims the benefit of U.S. Provisional Patent Application Ser. No. 62/508,668 filed on May 19, 2017. The disclosures of the above-referenced application are hereby incorporated by reference for all purposes.

BACKGROUND

Unless otherwise indicated herein, the materials described in this section are not prior art to the claims in this application and are not admitted to be prior art by inclusion in this section.

Despite developments in integrated circuitry and processing technologies, computers are still considered slow at boot-up or wake-up times. At boot-up or wake-up time, a computer needs to retrieve data from memory and execute essential programs. However, non-volatile memory (NVM) systems may be slow to write or read data. Part of the challenge with NVM systems is that they may include different blocks with different read/write speed capabilities, but those are accessed through different interfaces making the architecture more complex and causing further slow-down in inter- and intra-chip communications.

SUMMARY

Briefly stated, technologies are generally described herein for multi-block non-volatile memories with a single unified interface.

An example memory system may include one or more hybrid fast memory blocks with m-bit fast volatile random access memory (RAM) cells and N×m bit non-volatile memory (NVM) cells. The memory system may also include one or more other memory blocks with NVM cells. The fast flash memory may buffer the NVM data improving access speed. The different memory blocks may utilize a single, unified interface to communicate with other devices/circuits. The unified interface may be a parallel interface (e.g., flash memory/SRAM combinations), or the unified interface may be a pipeline interface (e.g., system on a chip "SOC" implementations) supporting fast memory read/write operations.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 6 is a table showing example read wait cycle configuration;

Figure 1A:
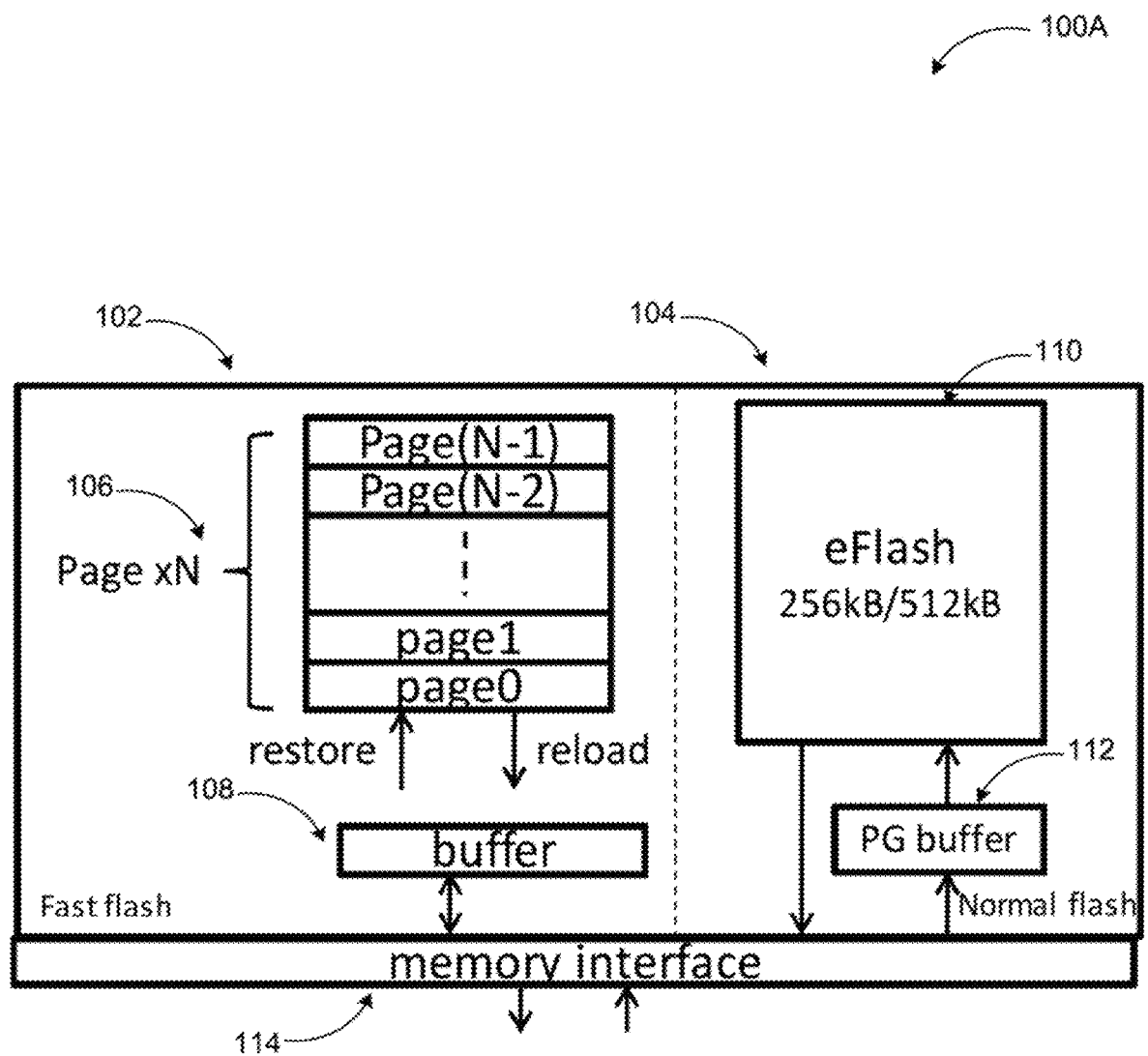
FIGS. 1A and 1B are diagrams illustrating an example multi-block NVM and operations thereon.

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for multi-block non-volatile memories with a single unified interface. In some examples, memory structures are provided, where the memory system may include one or more hybrid fast memory blocks with m-bit fast volatile random access memory (RAM) cells and N×m bit non-volatile memory (NVM) cells. The memory system may also include one or more other memory blocks with NVM cells. The fast flash memory may buffer the NVM data improving access speed. The different memory blocks may utilize a single, unified interface to communicate with other devices/circuits. The unified interface may be a parallel interface (e.g., flash memory/SRAM combinations), or the unified interface may be a pipeline interface (e.g., system on a chip "SOC" implementations) supporting fast memory read/write operations.

As used herein, NVM memory may include, but is not limited to, a floating gate memory, a SONOS memory, a RRAM (resistive RAM), phase change memories, or magnetic base memories, such as MRAM, and STTRAM, or a Ferroelectric based RAM, or Ferroelectric capacitor based memory.

Figure 1B:
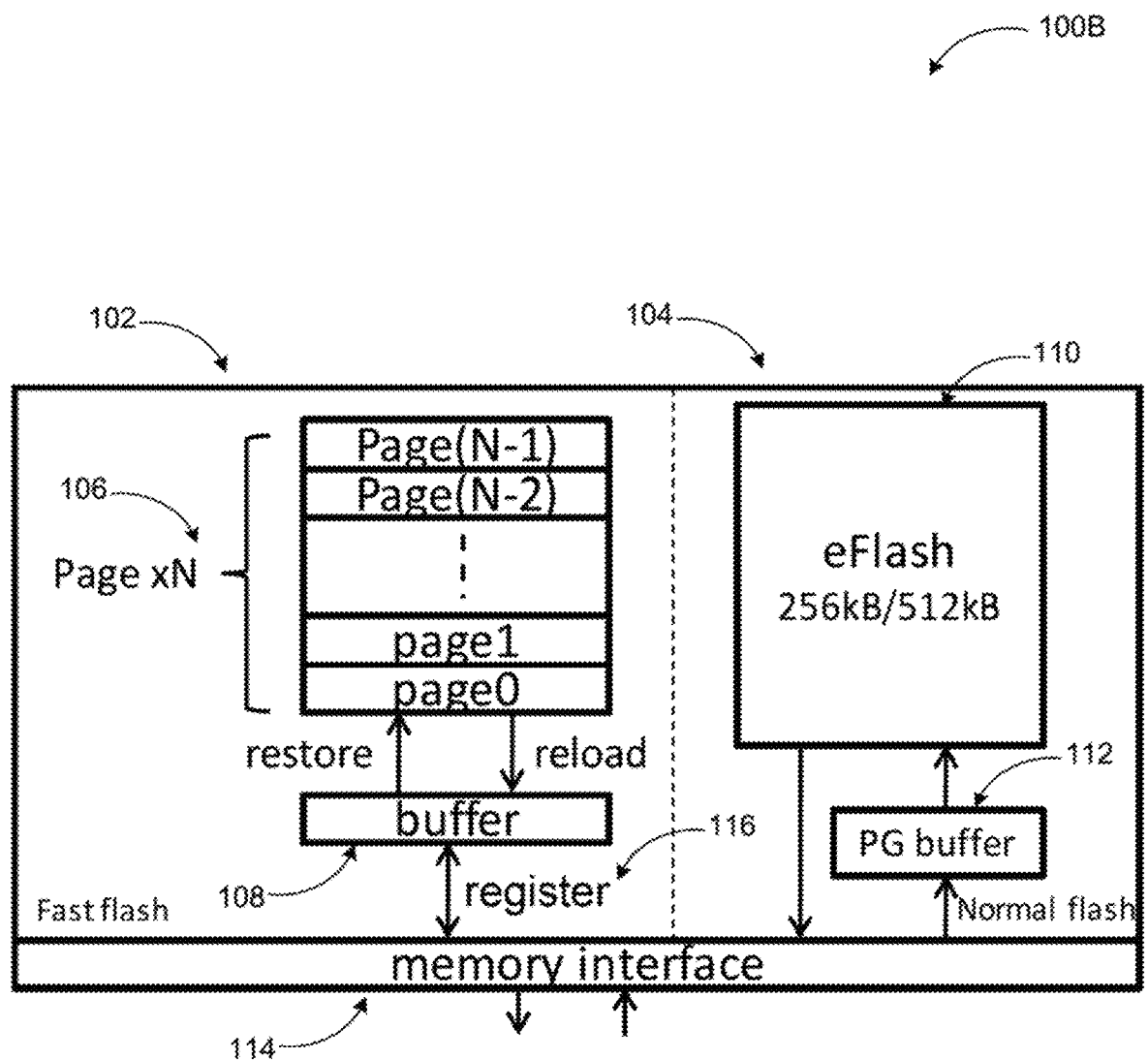

FIGS. 1A and 1B are diagrams illustrating an example multi-block NVM and operations thereon, arranged according to at least some embodiments presented herein.

Diagram 100A shows an example memory system that includes at least one fast flash memory 102 and/or at least one normal flash memory 104. The fast flash memory 102 may contain at least one non-volatile flash memory block 106, divided into N pages. The fast flash memory 102 may also contain at least one volatile memory buffer 108, which is faster than non-volatile memory. The buffer size may be equal to 1 or N (multiple) page sizes. The fast flash memory 102 may be used as a code flash, which may be accessed by a CPU/MCU directly in some examples. The fast flash memory 102 may store frequently used code/data to improve the system performance and/or reduce system power consumption. The fast flash memory may also store the boot code, which may improve the boot speed after power on, release form deep sleep, or system reset and etc. The normal flash memory 104 may include a flash component 110 and a page buffer 112. The internal normal flash interface and fast flash interface may be combined into a unified memory interface 114 according to some embodiments.

Diagram 100B shows Read or write in a flash memory may have a fast access speed when accessing the buffer directly. A reload operation may load the data from the flash memory block 106 into the buffer 108. A restore operation may write the data from the buffer 108 into the flash memory block 106. The buffer data may not be written into the flash memory without a restore operation. In some embodiments, the reload or restore operations may be executed through a register command 116. A fast flash memory can be a normal flash memory with a ram buffer, where a wider I/O between flash and ram may be needed. The fast flash memory may be a single-bit or multi-bit NVSRAM. The flash memory may also be any other non-volatile memories. The unified memory interface 114 may communicate with a system memory bus.

Figure 2A:
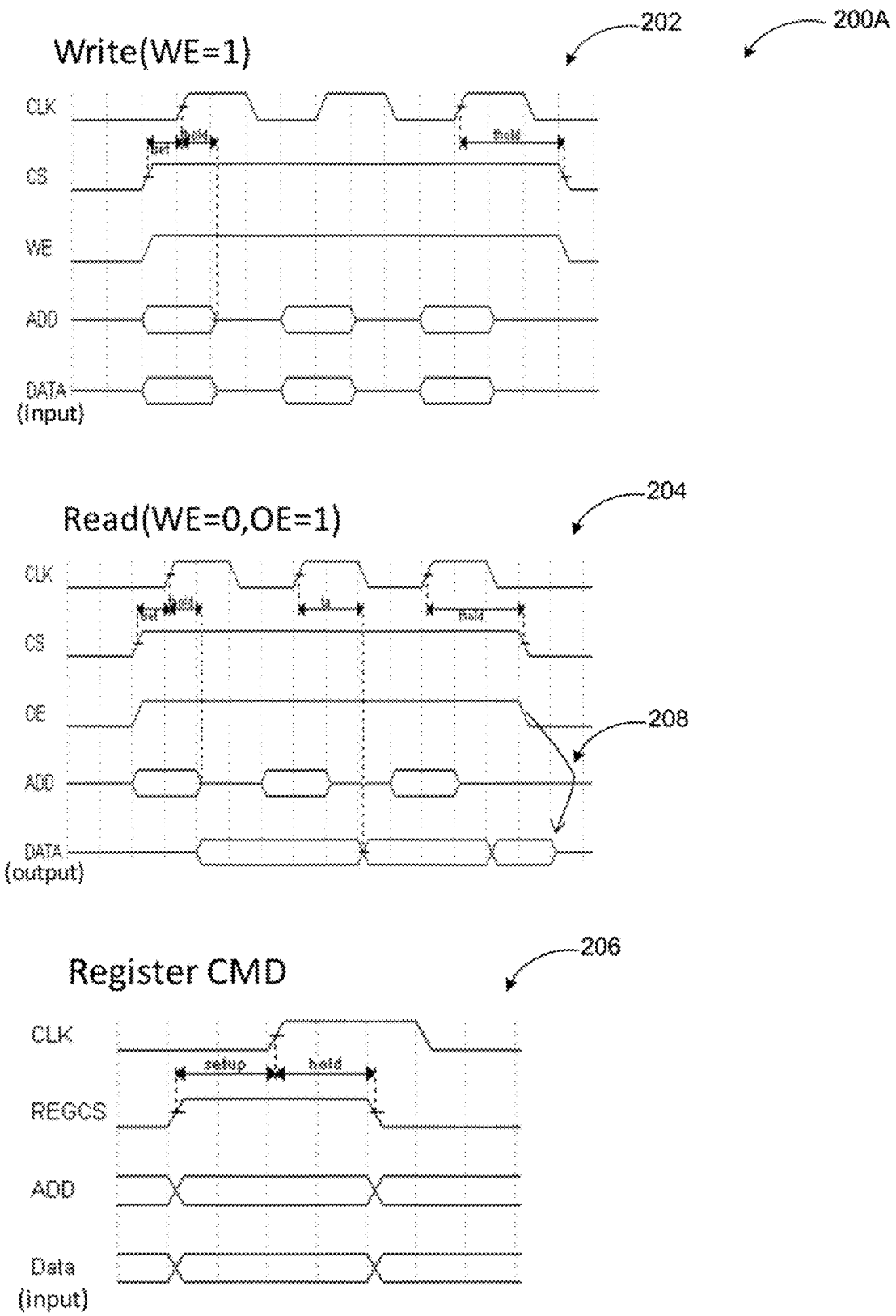
FIGS. 2A and 2B are diagram illustrating example waveforms in read/write operations.
Figure 2B:
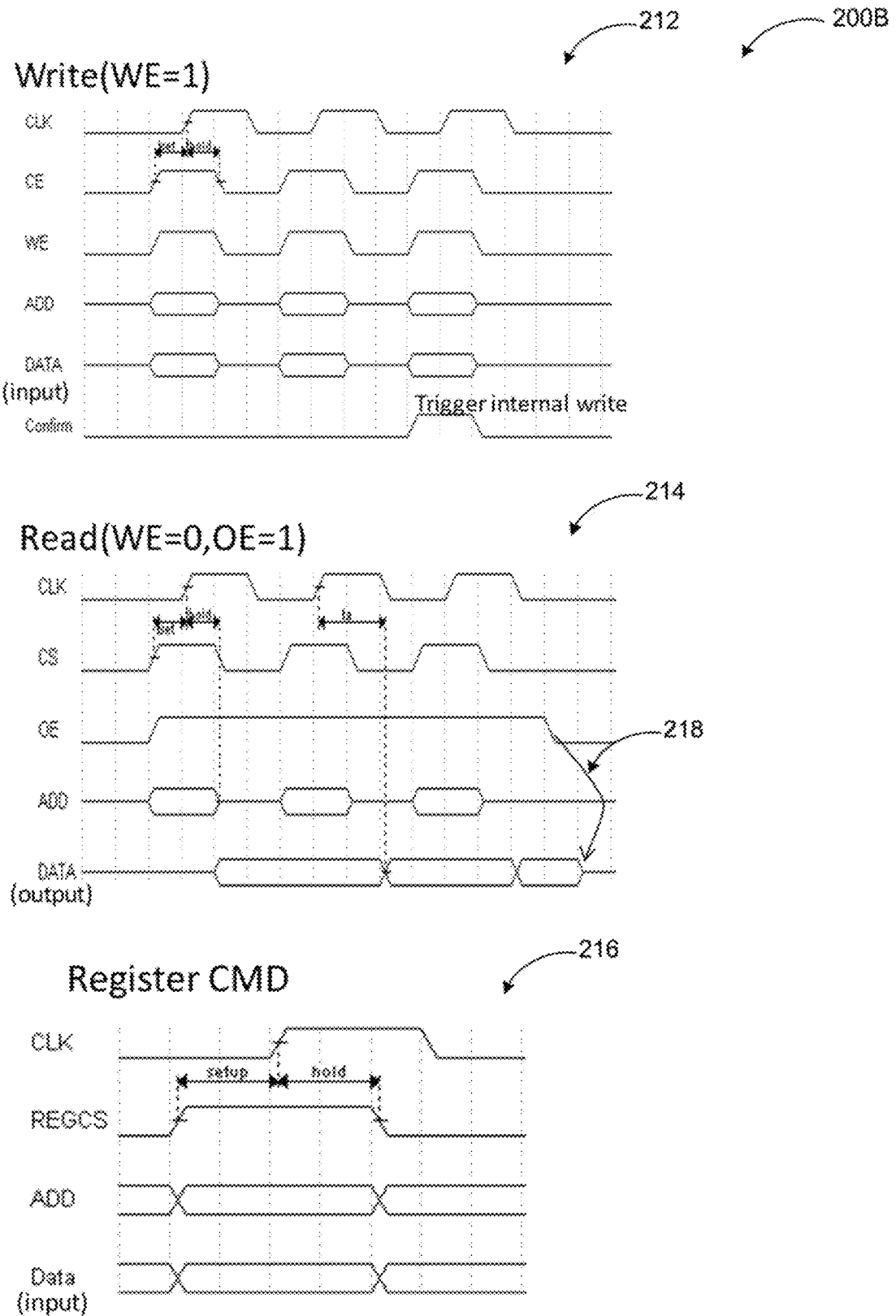

FIGS. 2A and 2B are diagram illustrating example waveforms in read/write operations, arranged according to at least some embodiments presented herein.

Diagram 200A shows a parallel interface waveform for a write operation 202, a read operation 204, and a register command 206. The normal flash memory may perform an internal write operation (write the non-volatile array) after CS/WE go low. OE going high and low may trigger beginning and end of output data in the read operation 208. A write operation to the non-volatile memory may also be triggered by a register command 206. The register command 206 may be used to execute reload or restore operations for the fast flash memory.

Diagram 200B shows another parallel interface waveform for a write operation 212, a read operation 214, and a register command 216. The normal flash memory may perform an internal write operation by the confirm signal. The write operation 212 to the non-volatile memory may also be triggered by a register command. The write phase may be put in discrete clock cycles. The register command 216 may be used to execute reload or restore operations for the fast flash memory.

Figure 3A:
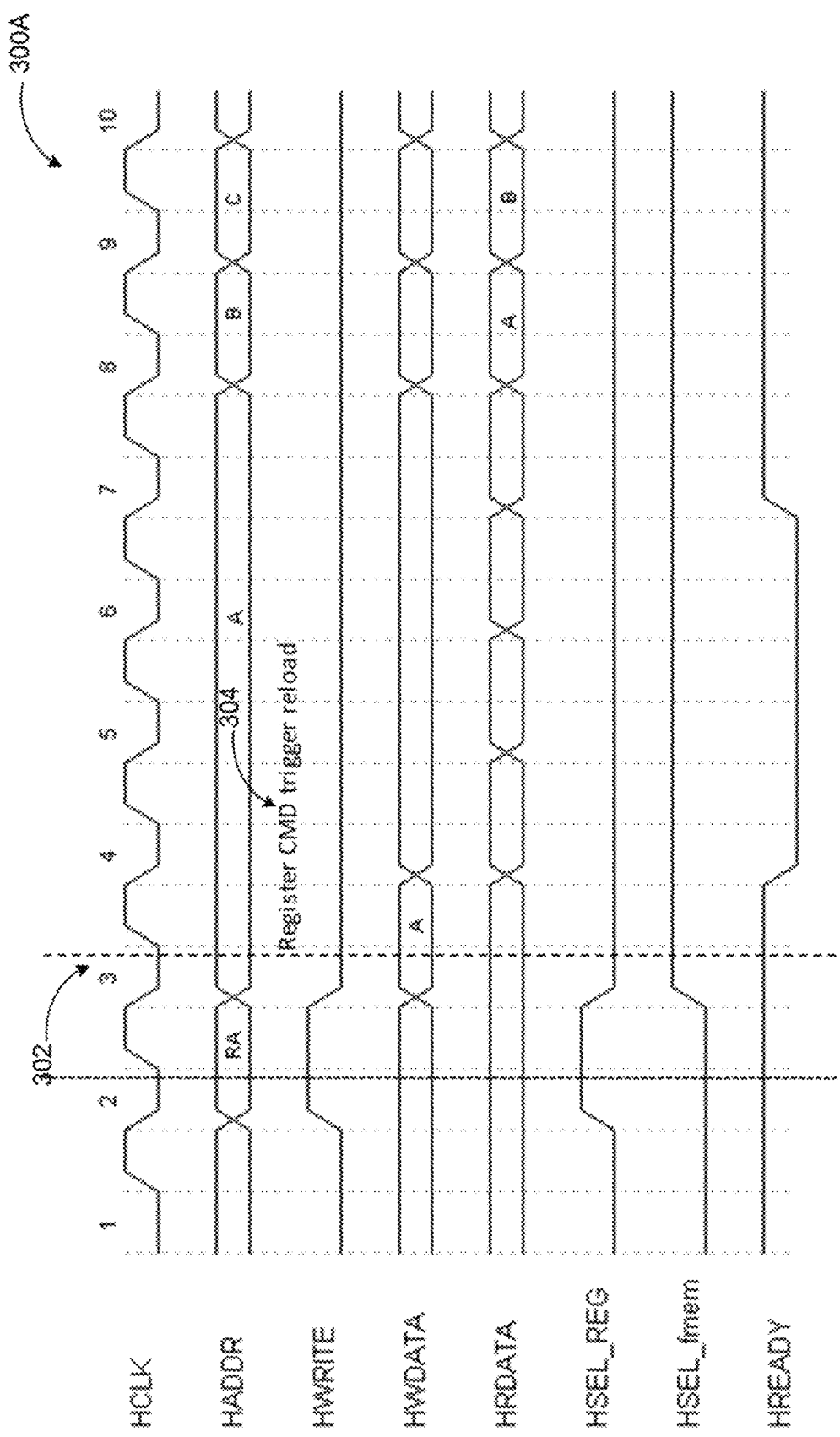
FIGS. 3A and 3B are diagrams illustrating example read operation waveforms in a pipeline interface.
Figure 3B:
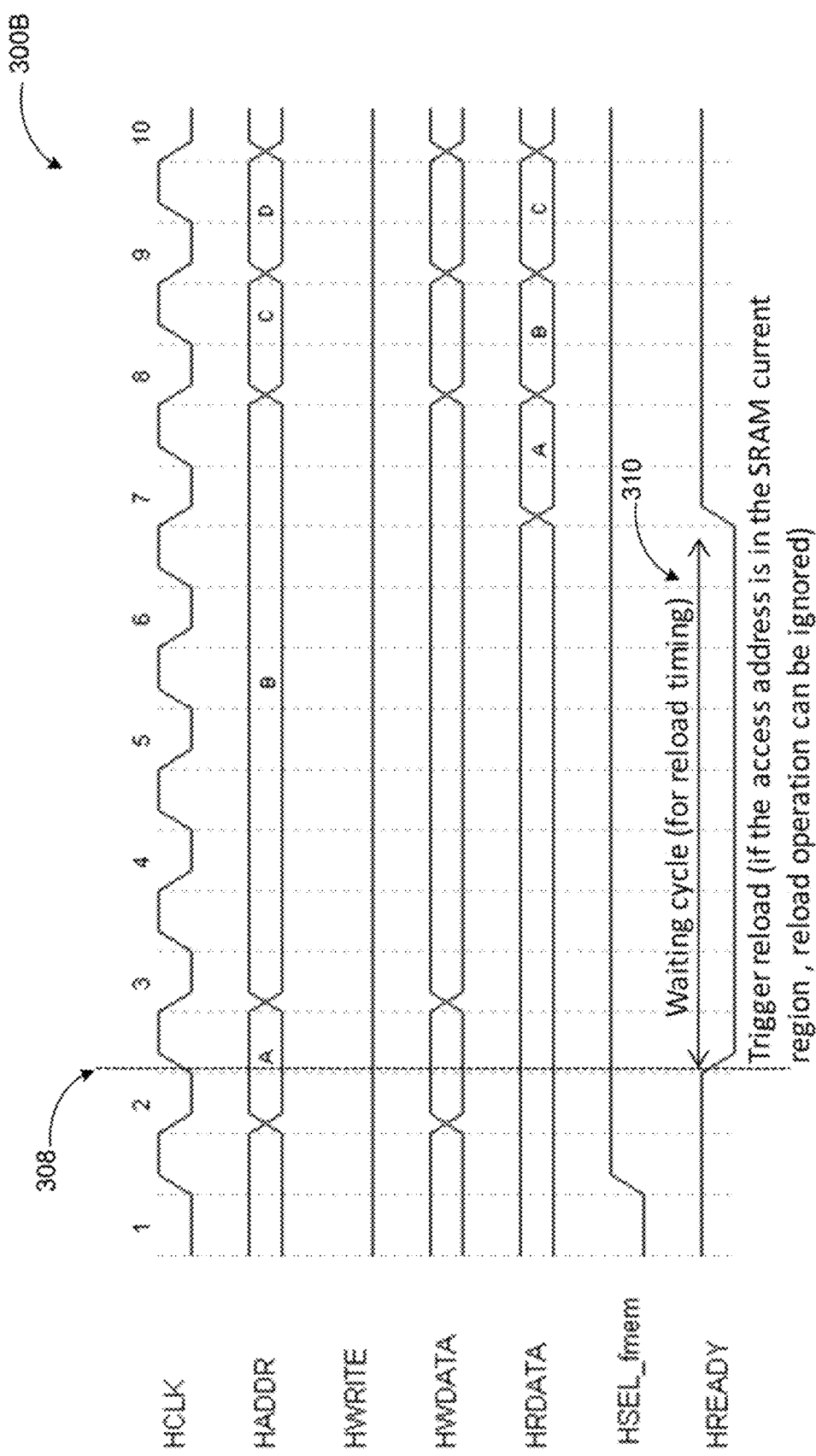

FIGS. 3A and 3B are diagrams illustrating example read operation waveforms in a pipeline interface, arranged according to at least some embodiments presented herein.

Diagram 300A shows various clock, signal, and data waveforms. A command bus/interface like the pipeline interface may make a system access the memory easier. When the access region is out of the buffer, a reload operation by a register command 304 may be executed at second HCLK rising edge, and third HCLK rising edge 302 may provide the HWDATA for the register command. HREADY may go high to indicate the reload operation end then the read operation.

Diagram 300B shows other example clock, signal, and data waveforms. When the access region is out of the buffer, a reload operation by a register command may be executed at second HCLK rising edge 308 (waiting cycle 310 for reload timing), and third HCLK rising edge may provide the HWDATA for the register command. Address A~D may be in a same page but out of the buffer region. HREADY go high to indicate the reload operation end then the read operation. Register command may not be needed to trigger the reload operation or ignored if the access address is in the SRAM current region. Any access out of the buffer region may re-trigger a reload operation.

Figure 4:
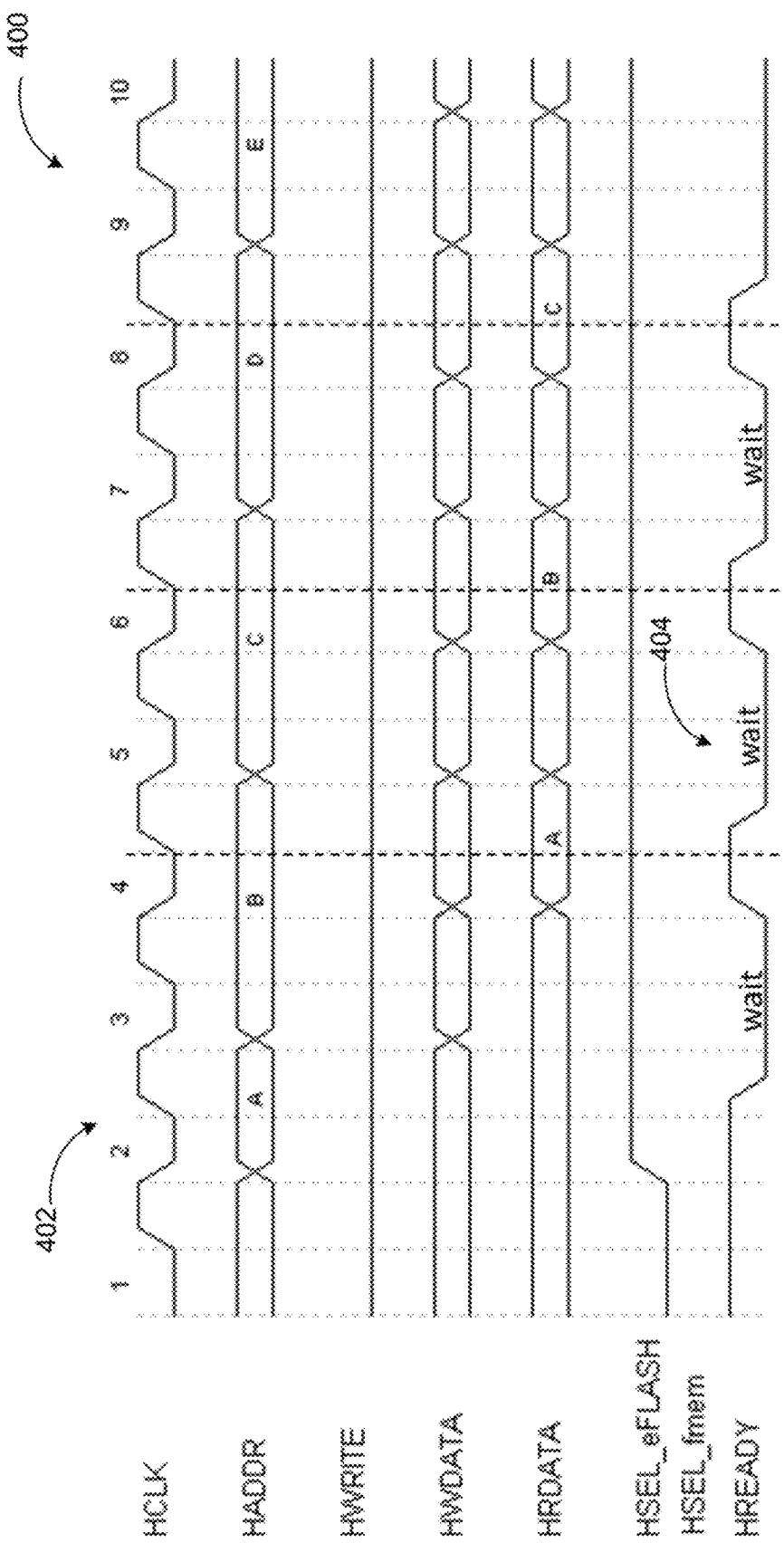
FIG. 4 is a diagram illustrating example read operation waveforms with wait cycles in a pipeline interface.

FIG. 4 is a diagram illustrating example read operation waveforms with wait cycles in a pipeline interface, arranged according to at least some embodiments presented herein.

Diagram 400 shows read operation waveforms with wait cycles in a pipeline interface. In a pipeline interface, the HREADY may go low to indicate the internal data read. In a fast system on a chip (SOC), the system clock cycle may be slower than the flash access speed, thus a wait cycle may be inserted to guarantee the data fetch. The waveforms in the diagram show a read operation with one wait cycle while the memory access time is between one clock cycle and two clock cycles. The wait cycle number may be configured by the register bits to optimize the system performance, according to the memory access speed and the system clock cycle. The fast flash and normal flash may use the same protocol, only insert different wait cycles to work with a fast system clock.

Figure 5:
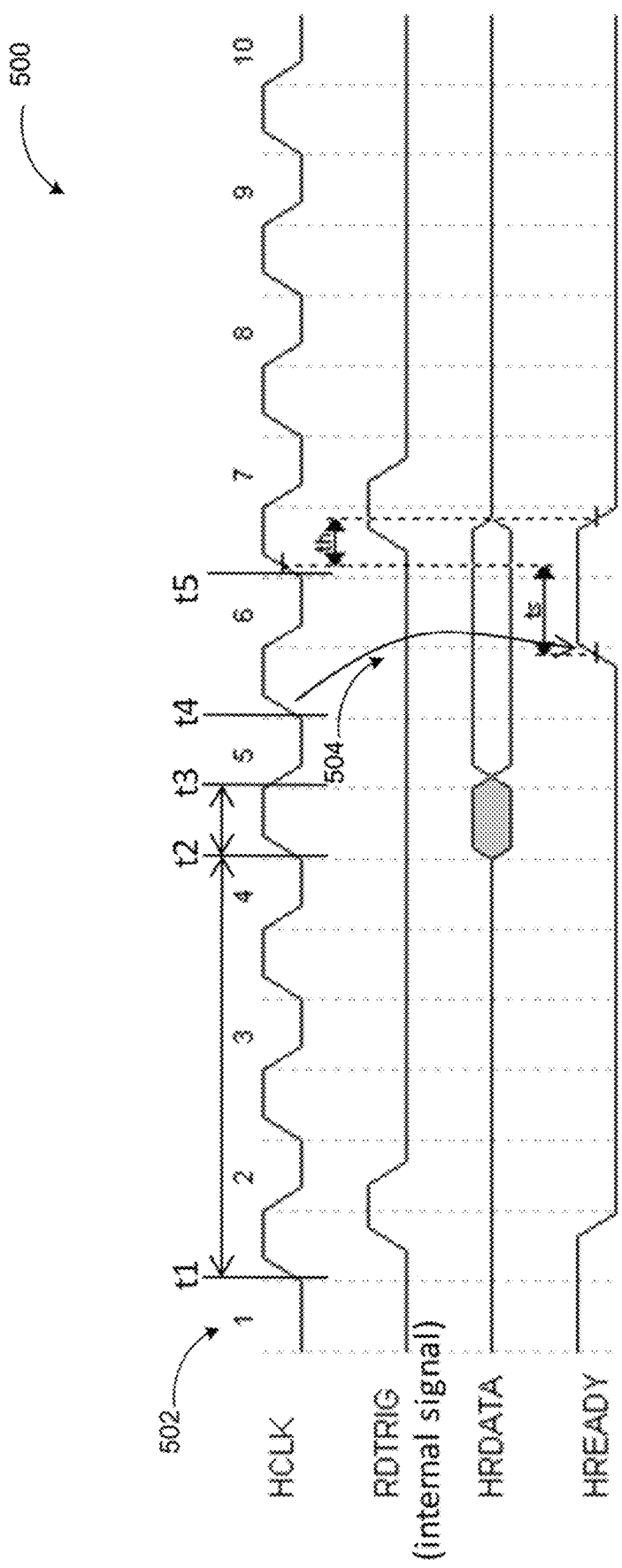
FIG. 5 is a diagram illustrating example read operation waveforms with wait cycles with timings.

FIG. 5 is a diagram illustrating example read operation waveforms with wait cycles with timings, arranged according to at least some embodiments presented herein.

Diagram 500 shows read operation waveforms with wait cycles timings according to an HREADY synchronous scheme. In this case the wait cycle number may not need to be configured and at least one wait cycle 502 inserted. The wait cycle may be dynamically controlled by the memory timing. When read data is ready, HCLK may synchronize the HREADY signal, which can guarantee the timing between HREAD/HRDATA and HCLK. The performance may be degraded as one more wait cycle is inserted, but a master circuit may not need to manage the timing. This scheme may not be applicable in scenarios where the flash access time is less than one clock cycle.

Control signal is not shown in the diagram. In the diagram, t1-t2, t1-t3 represent read access time; t2-t3 represents timing variation; t4 represents HREADY synchronization by HCLK when read data ready (in fast case, HREADY may go high at t2, one cycle ahead compared to the slow case); and t5 represents the data latch by master.

FIG. 6 is a table showing example read wait cycle configuration, arranged according to at least some embodiments presented herein.

Two register bytes may be used to define the wait cycle number according to the system frequency. Table 600 includes register bytes 612, type 614, and wait cycle number 616 for fast flash 602 and normal flash 604.

As mentioned previously, a memory system may include one or more hybrid fast memory blocks with m-bit fast volatile random access memory (RAM) cells and N×m bit non-volatile memory (NVM) cells. The memory system may also include one or more other memory blocks with NVM cells. The fast flash memory may buffer the NVM data improving access speed. The NVM cells may be charge-tapping based flash memory cells, SONOS flash cells, floating gate flash memory cells, Resistance based RRAM memory cells, MRAM, or ferroelectric RAM cells. The different memory blocks (fast SRAM/non-volatile memory hybrid blocks and non-volatile memory blocks) may utilize a single, unified interface to communicate with other devices/circuits. The unified interface may be a parallel interface or a pipeline interface supporting fast memory read/write operations.

Figure 7:
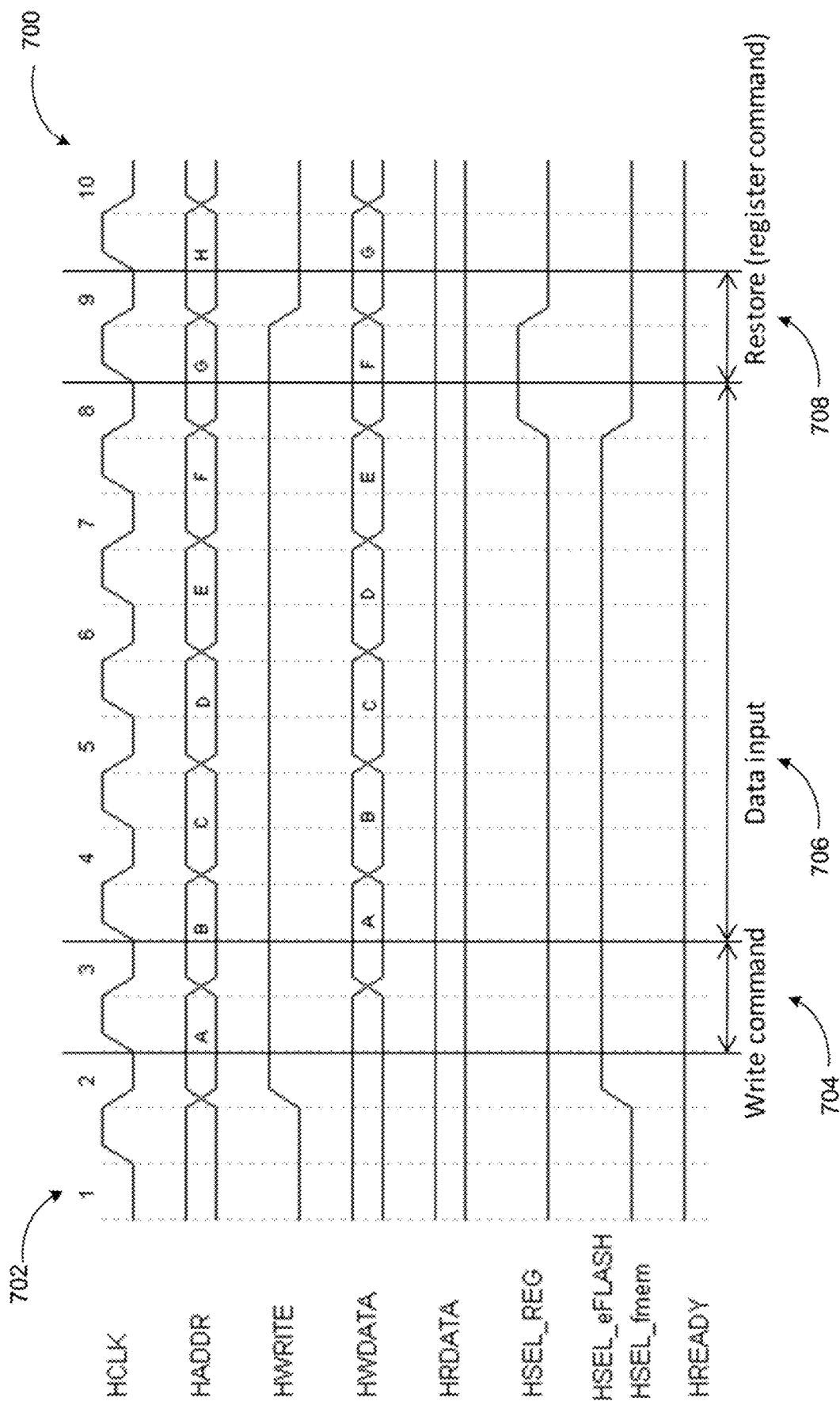
FIG. 7 is a diagram illustrating example write operation waveforms with wait cycles in a pipeline interface.

FIG. 7 is a diagram illustrating example write operation waveforms in a pipeline interface, arranged according to at least some embodiments presented herein.

Diagram 700 shows write operation waveforms. In a pipeline interface, one clock rising edge may be used to latch the write command 704, following rising edge to latch the write data. The input data 706 may be written into the buffer, then a register command may be used to execute a restore operation 708. The normal flash memory may also need a register command to trigger the flow to write the data from its page buffer to non-volatile array. When the buffer write time is larger than the system clock cycle time, wait cycle(s) may need to be inserted to guarantee the data transfer. The wait cycle(s) may also be configured by some register bits. The wait cycle(s) may be automatically controlled by HREAD synchronous scheme in some examples.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

A multi-block, single interface NVM according to embodiments is not limited to floating gate memories, but may also be a SONOS memory, a RRAM (resistive RAM), phase change memories, or magnetic base memories, such as MRAM, and STTRAM, or a Ferroelectric based RAM, a Ferroelectric capacitor based memory, or comparable NVMs.

Some embodiments are directed to example processes to operate multi-block, single interface NVM. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 8:
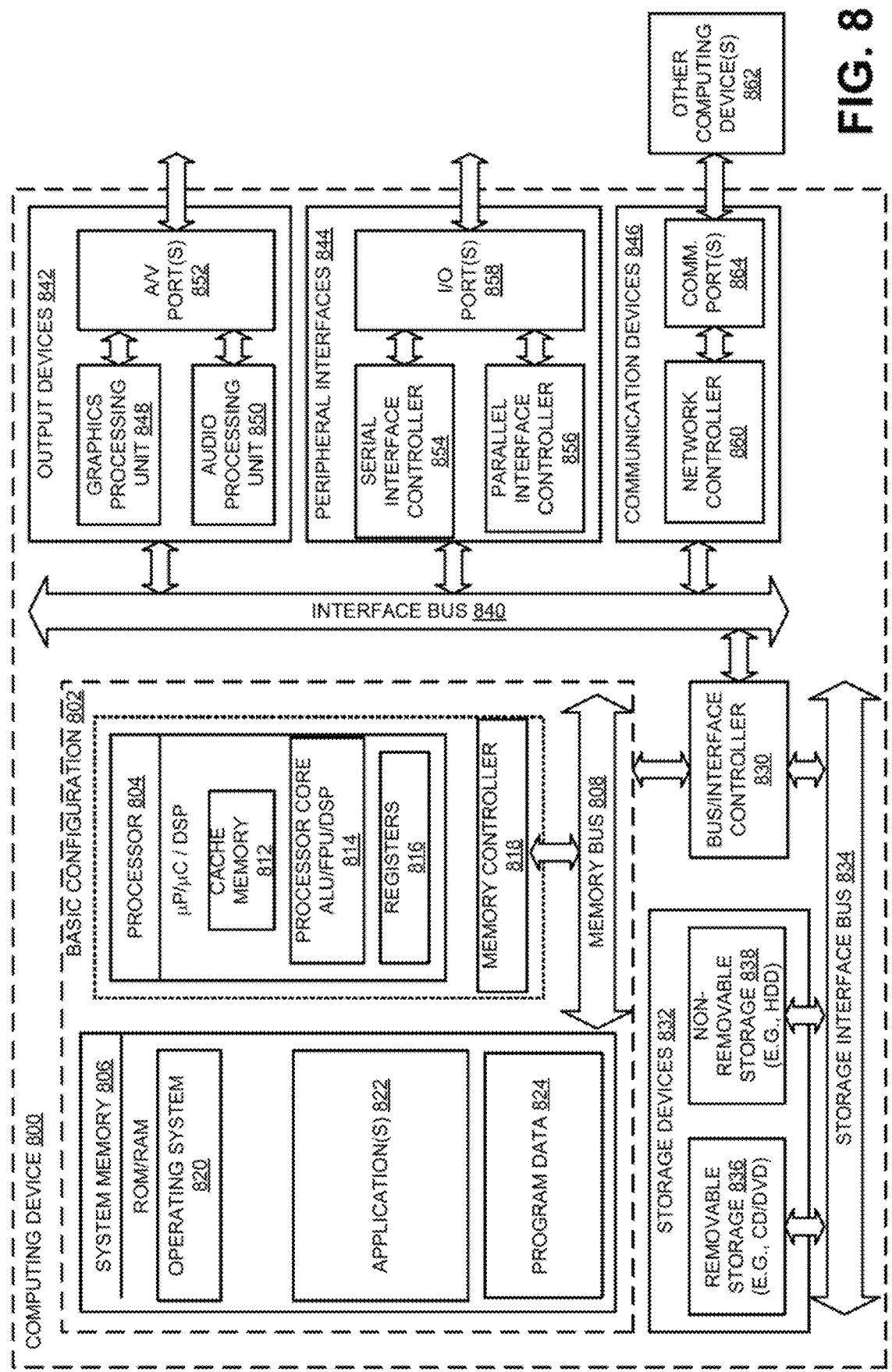
FIG. 8 is a block diagram illustrating an example computing device that is arranged for implementing example multi-block NVM structures as discussed herein.

FIG. 8 is a block diagram illustrating an example computing device 800 that is arranged for implementing and/or operating multi-block, single interface NVMs as discussed herein, in accordance with at least some embodiments described herein. In a very basic configuration 802, computing device 800 typically includes one or more processors 804 and system memory 806. A memory bus 808 can be used for communicating between the processor 804 and the system memory 806.

Depending on the desired configuration, processor 804 can be of any type including but not limited to a microprocessor (µP), a microcontroller (µC), a digital signal processor (DSP), or any combination thereof. Processor 804 can include one more levels of caching, such as cache memory 812, a processor core 814, and registers 816. The processor core 814 can include an arithmetic logic unit (ALU), a floating point unit (FPU), a digital signal processing core (DSP core), or any combination thereof. A memory controller 818 can also be used with the processor 804, or in some implementations the memory controller 88 can be an internal part of the processor 804.

Depending on the desired configuration, the system memory 806 can be of any type including but not limited to volatile memory (such as RAM), non-volatile memory (such as ROM, flash memory, etc.) or any combination thereof. System memory 806 typically includes an operating system 820, one or more applications 822, and program data 824.

Computing device 800 can have additional features or functionality, and additional interfaces to facilitate communications between the basic configuration 802 and any required devices and interfaces. For example, a bus/interface controller 840 can be used to facilitate communications between the basic configuration 802 and one or more data storage devices 832 via a storage interface bus 834. The data storage devices 832 can be removable storage devices 836, non-removable storage devices 838, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 806, removable storage 836 and non-removable storage 838 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 800. Any such computer storage media can be part of device 800. Thus, any of the computer storage media may be implemented using the SRAM based memory structures as discussed herein.

Computing device 800 can also include an interface bus 840 for facilitating communication from various interface devices (e.g., output interfaces, peripheral interfaces, and communication interfaces) to the basic configuration 802 via the bus/interface controller 830. Example output devices 842 include a graphics processing unit 848 and an audio processing unit 850, which can be configured to communicate to various external devices such as a display or speakers via one or more A/V ports 852. Example peripheral interfaces 844 include a serial interface controller 854 or a parallel interface controller 856, which can be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which can be arranged to facilitate communications with one or more other computing devices 862 over a network communication via one or more communication ports 864. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 800 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multi-block non-volatile memory (NVM) device with a single, unified interface, the device comprising:
   at least one fast flash memory comprising a non-volatile flash memory block divided into N pages and a volatile buffer;
   at least one normal flash memory comprising a flash memory block and a page buffer; and
   a unified memory interface configured to facilitate intra-chip or extra-chip communications for read and write operations.

2. The device of claim 1, wherein the unified memory interface is a parallel interface or a pipeline interface.

3. The device of claim 1, wherein a reload operation is used to load data from the non-volatile flash memory block into the volatile buffer and from the flash memory block into the page buffer.

4. The device of claim 1, wherein a restore operation is used to write data from the volatile buffer into the non-volatile flash memory block and from the page buffer into the flash memory block.

5. The device of claim 1, wherein the at least one fast flash memory is a single bit or a multi-bit non-volatile static random access memory (NVSRAM).

6. The device of claim 1, wherein the at least one normal flash memory is configured to perform an internal write operation in response to a confirm signal or a CS/WE signal switching to a low value.

7. The device of claim 1, wherein a register command is used to perform reload or restore operations for the at least one fast flash memory and the at least one normal flash memory.

8. The device of claim 1, wherein the at least one fast flash memory and the at least one normal flash memory include SONOS transistor cells, floating gate cells, eFlash cells, pFlash cells, 1T/1R resistive RAMs, resistive memory based cells, phase change memory based cells, ferroelectric RAM based cells, ferroelectric capacitor based cells, or magnetic RAM based cells.

9. A multi-block non-volatile memory (NVM) device with a single, unified interface, the device comprising:
   at least one fast flash memory comprising a non-volatile flash memory block divided into N pages and a volatile buffer;
   at least one normal flash memory comprising a flash memory block and a page buffer; and a unified memory interface configured as a parallel interface or a pipeline interface to facilitate intra-chip or extra-chip communications, wherein a register command is used to perform reload or restore operations for reading and writing from and to the at least one fast flash memory and the at least one normal flash memory.

10. The NVM device of claim 9, wherein at least a portion of the at least one fast flash memory is configured to store one or more of a boot code, a wake-up code, and an executable code for a computing system.

11. The NVM device of claim 9, wherein a reload operation by a register command is executed at a second clock signal rising edge and a third clock signal rising edge provides data delivery for the register command when an access region is out of the volatile buffer.

12. The NVM device of claim 9, wherein at least one wait cycle is inserted when a system clock cycle is slower than a flash memory access speed.

13. The NVM device of claim 12, wherein a number of wait cycles to be inserted is configured by one or more register bits based on the flash memory access speed and the system clock cycle to optimize a system performance.

14. The NVM device of claim 12, wherein the at least one fast flash memory and the at least one normal flash memory are configured to use a same protocol with different numbers of wait cycles.

15. The NVM device of claim 12, wherein a system clock signal is used to synchronize a ready signal in order to dynamically control wait cycle numbers.

16. The NVM device of claim 9, wherein a clock rising edge is used to latch a write command and a subsequent rising edge is used to latch write data in a pipeline unified interface configuration.

17. The NVM device of claim 9, wherein input data is written into one of the volatile buffer and the page buffer, and the register command is used to execute a restore operation to write the buffered input data into a respective one of the at least one fast flash memory and the at least one normal flash memory.

* * * * *